United States Patent
Sano et al.

[19]

[11] Patent Number: 6,097,084
[45] Date of Patent: Aug. 1, 2000

[54] PHOTOINTERRUPTOR

[75] Inventors: Masashi Sano; Yasue Bamba; Shinichi Suzuki; Kenichi Nakai, all of Kyoto, Japan

[73] Assignee: Rohm Co., Ltd., Kyoto, Japan

[21] Appl. No.: 09/077,893

[22] PCT Filed: Oct. 22, 1997

[86] PCT No.: PCT/JP97/03834

§ 371 Date: Jun. 15, 1998

§ 102(e) Date: Jun. 15, 1998

[87] PCT Pub. No.: WO98/18168

PCT Pub. Date: Apr. 30, 1998

[30] Foreign Application Priority Data

Oct. 22, 1996 [JP] Japan .................................. 8-279200

[51] Int. Cl.⁷ ...................... H01L 33/00; H01L 31/0203; H01L 27/15
[52] U.S. Cl. ............................ 257/678; 257/99; 257/433; 257/80; 257/81; 257/82
[58] Field of Search ............................ 257/678, 99, 433, 257/80–82

[56] References Cited

U.S. PATENT DOCUMENTS

| | | |
|---|---|---|
| 4,933,729 | 6/1990 | Soejima et al. ........................... 257/80 |
| 4,977,317 | 12/1990 | Iwashima ................................. 250/239 |
| 5,214,495 | 5/1993 | Kitanishi ................................... 257/80 |
| 5,391,346 | 2/1995 | Nakamura et al. ................. 264/272.14 |
| 5,436,472 | 7/1995 | Ogawa ...................................... 257/82 |

FOREIGN PATENT DOCUMENTS

| | | |
|---|---|---|
| 359018683 | 1/1984 | Japan . |
| 362078887 | 4/1987 | Japan . |
| 362170872 | 7/1987 | Japan . |
| 362251616 | 11/1987 | Japan . |
| 401020479 | 1/1989 | Japan . |
| 405226690 | 9/1993 | Japan . |

*Primary Examiner*—David Hardy
*Assistant Examiner*—Jhihan B Clark
*Attorney, Agent, or Firm*—Arent Fox Kintner Plotkin & Kahn, PLLC

[57] ABSTRACT

A light emitting element (1) and a light receiving element (2) are oppositely fixed through a space by an opaque-material package (3) to allow transmission and reception of light therebetween. The light emitting element and the light receiving element have leads which are outwardly extended from a bottom surface (A) of the package (3) and inserted into and soldered to through-holes of a substrate. A movement-preventing bend portion (11g, 21g) having at least a first bend point is formed at a position smaller than a thickness of the substrate from the bottom surface of the package. As a result, where the leads of the photointerrupter are inserted into and soldered to a printed substrate or the like, soldering is possible without causing inclination or positional deviation.

8 Claims, 3 Drawing Sheets

PHOTOINTERRUPTOR

TECHNICAL FIELD

This invention relates to a photointerrupter having a light emitting element and a light receiving element oppositely placed through a space to determine a presence or absence of an object passing through the space or the like. More specifically, the invention relates to a photointerrupter having leads provided with a fixing means to prevent against inclination of fitting in soldering, where the photointerrupter is mounted onto a printed substrate and the leads are soldered thereto.

PRIOR ART

A photointerrupter 10 generally has, as shown in FIGS. 5(a)–(b), a light emitting element 1 and a light receiving element 2 that are oppositely placed with a constant gap and fixed by a package 3 of an opaque molded resin or case, enabling light transmission and reception. The photointerrupter 10 has leads 11, 12 for the light emitting element 1 and leads 21, 22 for the light receiving element 2, so that the leads 11, 12, 21, 22 are inserted into through-holes 4a of the printed substrate 4 and soldered by a flow solder to the printed substrate 4.

The photointerrupter 10 of this kind is arranged to have a space 3b oppositely defined by the light emitting element 1 and the light receiving element 2 to allow an object to be detected to pass therethrough. When the light emitted from the light emitting element 1 is blocked, the light receiving element 2 cannot receive the light. When the object to be detected is not in passing, the light receiving element 2 can receive the light emitted by the light emitting element 1. Thus, the object to be detected can be determined of the presence or absence in the opposedly-defined space 3b. However, this opposedly-defined space 3b has an interval of as small as several mm or less (e.g. the interval of the space is approximately 5 mm, where the package has a size of width×thickness (depth)×height of approximately 13.5 mm×5 mm×10 mm). Accordingly, if positional deviation or inclination is present, the object to be detected cannot pass through the oppositely-defined space 3b or the object to be detected is difficult to be accurately detected. For this reason, the mounting of the photointerrupter 10 onto the printed substrate 4 has to be accurately controlled in height or position by abutting a bottom surface of the package 3 against the printed substrate 4 so that the leads can be insert and soldered, by a flow solder, to through-holes formed in the printed substrate 4.

Where the leads of the photointerrupter are inserted and soldered to through-holes of a printed substrate as stated above, there may be a case that the photointerrupter is inclined or deviated in position due to the movement caused by vibrations during transportation in the solder process. That is, the photointerrupter is extremely small in size and light in weight as stated before. Further, the leads of the photointerrupter is merely inserted into the through-holes of the printed substrate, wherein the diameter of the through-hole is considerably larger (1.3–1.5 times) than the thickness of the lead (diagonal length where rectangular in section). Consequently, if vibration occurs, the photointerrupter is ready to float up. If there occurs floating, inclination or positional deviation during transport, the photointerrupter is soldered at a position as it is, thus being fixed in a state of inclination or deviation in position. In particular, since the photointerrupter is utilized to detect a presence or absence of an object to be detected or a change of state by passing the object to be detected through the gap defined between the light emitting element and the light receiving element. Accordingly, where there is deviation (floating or inclination vertical to the printed substrate) in height or inclination in a horizontal direction even in slight, the object to be detected becomes difficult to move through an opposed portion between the light emitting element and the light receiving element, impairing the function as a sensor. In order to avoid this, devising is made such that soldering is performed by placing a weight on a photointerrupter during soldering. However, the fixation is not positive due to small in size of the photointerrupter, thus raising a problem of increasing the percentage of unacceptable products due to floating or the like. The floating or positional deviation of components to a printed substrate during solder is not limited to the photointerrupters and may be encountered in such electric components as resistors, capacitors and ICs. However, the electric parts such as resistors, capacitors and ICs involves no serious problem as to the position itself provided that the lead can be placed in positive electrical contact by solder or the like. Although in such a component devising is made as to positioning due to limitation in height or providing self-standability by corrugating the lead as shown in Japanese Laying-Open Utility Model Publication No. S57-22270, there is almost no case of raising problem in slightly floating or deviation in position.

The present invention has been made in order to solve the above-stated problem, and it is an object to provide a photointerrupter with which soldering can be made by inserting a leads of the photointerrupter to a substrate without causing floating in a direction vertical to the substrate or requiring an additional complicated manufacture process such as working the leads after being inserted into a through-hole.

It is another object of the present invention to provide a photointerrupter which can be soldered without incurring inclination in a horizontal direction when the lead of the photointerrupter is soldered to a printed substrate or the like.

DISCLOSURE OF THE INVENTION

A photointerrupter according to the present invention, comprising: a light emitting element having a lead; a light receiving element having a lead; a package for oppositely fixing the light emitting element and the light receiving element through a space so that light transmission and reception can be made therebetween, and having a bottom surface from which the leads outwardly extend; and a float preventing bend portion having at least a first bend point formed in the leads extending from the bottom surface of the package at a dimensional position smaller than a thickness of the substrate to which the lead from the bottom surface is inserted into and fixed to a through-hole.

With this structure, the package at its bottom surface is closely contacted with a substrate such as the printed substrate. Due to the bend portion of the lead, floating is prevented and vertical movement is completely suppressed. As a result, floating or inclination does not occur during soldering or the like. For a photointerrupter requiring extremely exact positional accuracy, soldering can be made in accurate position and direction by a simple method without requiring a weight or the like.

If the bend portion is structured to further have a second bend point at a dimensional position greater than the thickness of the substrate from the bottom surface of the package, the second bend point is inserted toward a back side of the substrate by the springiness of the lead. The substrate is clamped by the bottom surface of the package and the second bend point portion of the lead, being further firmly fixed. Specifically, the first bend point is provided in the vicinity of a central axis of the leads extending from the light emitting element and the light receiving element, and the second bend point is provided at a position greater than a radius of the through-hole of the substrate from the central axis. Or otherwise, the first bend point is provided at a position that contacts with an inner wall of the through-hole when the lead is inserted into the through-hole, and the second bend point is provided at a position that is outward of the inner wall of the through-hole when the lead is inserted into the through-hole. Incidentally, if the vertical (radial) position of the second bend point to a lead axis (a central axis of the lead), when an external force is applied, the second bend point passes through the through-hole to the back side of the substrate.

The bend portion may have further a second bend point at a dimensional position smaller than the thickness of the substrate from the bottom surface of the package, and the first and second bend points are each formed contactable with the inner wall of the throughhole. With such a structure, the first bend point and the second bend point are contacted with inner walls of the through-holes, and firmly fixed with the bottom surface of the package without movement due to vibration or the like. A third bend point may be further provided at a dimensional position smaller than the thickness of the substrate from the bottom surface of the package. If the third bend point is formed abutable against the inner wall of the through-hole, further firm fixing is provided.

A projection (small in clearance) that can be fitted to a fitting hole formed in the substrate may be provided on the bottom surface of the package. This enables the positioning in a horizontal direction to be positively made even if a clearance between the lead and the through-hole is large. The projection may be provided two or more at asymmetric locations with respect to a center point on the bottom surface of the package. This structure is preferred because, when the photointerrupter is reversed in direction, the projection will not fit in the fitting hole, eliminating the possibility of soldering in reverse direction.

BEST FORM FOR PRACTICING THE INVENTION

Figure 1:
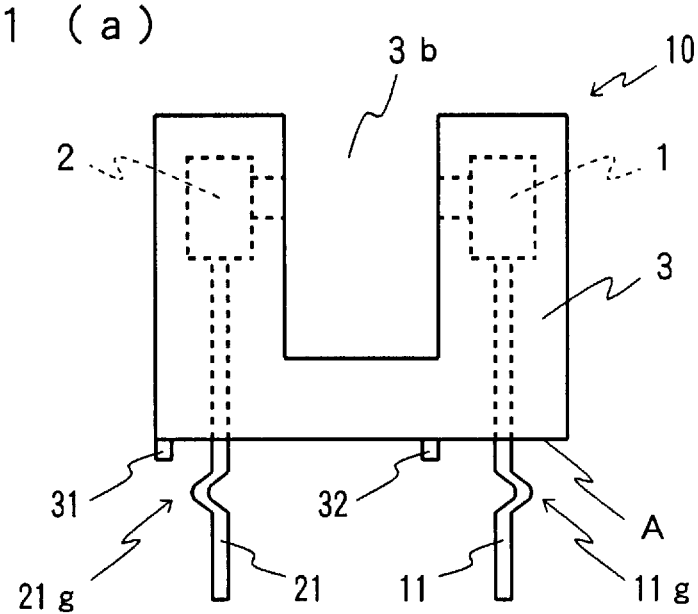
FIGS. 1(a) to 1(c) are a side view of one example of a photointerrupter of the present invention, an explanatory view showing a relationship between a through-hole of a substrate and a lead when mounted on the substrate such as a printed substrate, and a bottom view.
Figure 1:
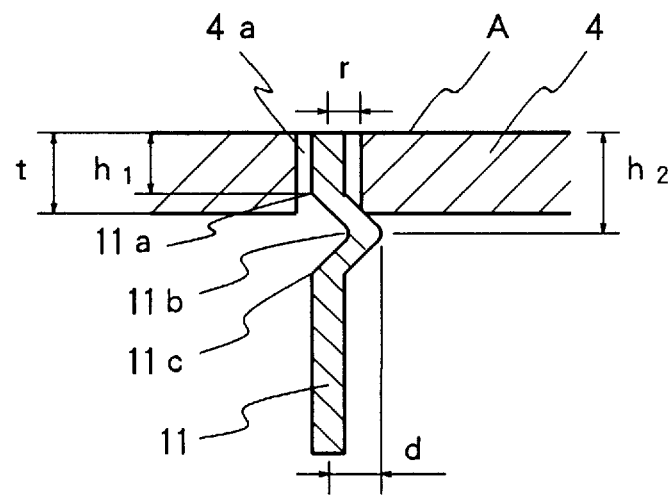
Figure 1:
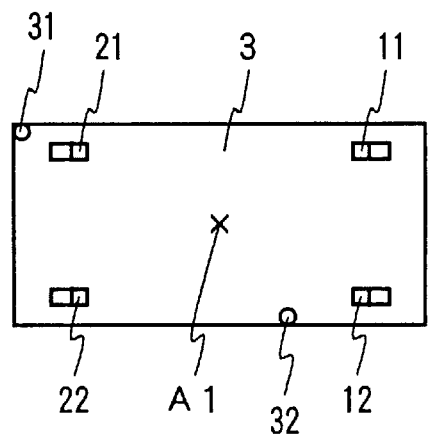

The photointerrupter of the invention will now be explained with reference to the drawings.

A photointerrupter 10 of the invention, as shown in FIG. 1(a), has an opposed light emitting element 1 and light receiving element 2 to allow transmission and reception of light therebetween, wherein they are fixed by an opaque material case or molding-resin package 3 formed of an opaque material for a wavelength of the light to be received by the light receiving element 2, preventing an external light from intruding therein. The package 3 covers separately the light emitting element 1 and the light receiving element 2, except for light transmitting and receiving portions for the light emitting element 1 and the light receiving element 2, thereby providing a space 3b at a opposed portion of them. The light emitting element 1 and the light receiving element 2 respectively have leads 11, 21 so that the leads 11, 21 extends from a bottom surface of the package 3 to the outside. The photointerrupter 10 of the present invention is characterized in that these leads 11, 12 each have, at a portion extending outward from the bottom surface of the package 3, a float-preventing bend portion 11g, 12g having at least a first bend point 11a formed at a position that is smaller than a thickness of a substrate through which the lead is fixed by being inserted into a through-hole. Incidentally, although the light emitting element 1 and the light receiving element 2 each have two leads 11, 12, 21, 22 extending therefrom as shown in a bottom view in FIG. 1(c), the two leads are respectively formed with bend portions in a same form as viewed from a side thereof. They are overlappingly seen in the side view shown in FIG. 1(a). Incidentally, in FIG. 1(a) and FIG. 1(c), 31, 32 are first and second projections for preventing positional deviation due to rotation in a horizontal direction.

The bend portions 11g, 21g of the leads 11, 21 are formed in such a positional relationship, for example, as to a through hole 4a and a lead 11 as shown in FIG. 1(b), wherein the lead 11 is inserted into the through-hole 4a of the substrate 4 and the photointerrupter is mounted on the substrate 4. That is, the lead 11 extends straight from a light emitting portion of the light emitting element 1 (the center of lead 11 in this direction is hereinafter referred to as a lead central axis). The lead is bent in a direction away from a central axis of the lead 11 at a first bend point 11a located at a distance h smaller than a thickness t of the substrate 4 from a bottom surface A of the package. The lead 11 is then bent toward the central axis side at a second bend point 11b located at $h_2$ that is greater than the thickness t of the substrate of the bottom surface A of the package 3, and has a third bend point 11c such that it extends along the central axis therefrom. The first to third bend points 11a–11c are formed in the above-stated positional relationship in a vertical direction relative to the thickness of the substrate 4 attached.

On the other hand, the positional relationship in a direction (radial direction) rectangular to a central axis direction of extension of the leads 11 is as follows. That is, the first and third bend points 11a, 11c are formed in the vicinity of the central axis that the lead 11 extends. The second bend point 11b is formed at a position that the distance d from the central axis to an outer end that the lead 11 is bent is greater than a radius r of the through-hole 4a. Incidentally, if this distance d is excessively great, the lead 11 becomes difficult to insert into the through-hole 4a during mounting a photointerrupter onto the substrate 4. It is preferred that the distance is approximately 2.5 r or the smaller.

As a concrete example, where the photointerrupter having a lead 11 with a thickness of 0.4 mm×0.45 mm, with a rectangular section, is mounted by insertion to a substrate 4 with a thickness of 1.2 mm or 1.6 mm having a through-hole 4a having a diameter of approximately 0.8–1 mm, the distance $h_1$ of the first bend point 11a from the bottom surface A is given of approximately 1 mm and the distance h₂ of the second bend point 11b from the bottom surface A is of approximately 2 mm. Also, the distance d of the second bend point 11b from the central axis to the outer end is given approximately 0.75–0.95 mm.

Projections 31, 32 are provided in order to prevent against positional deviation such as rotation in the horizontal direction, as shown in FIG. 1(a) and FIG. 1(c), during soldering the leads of the photointerrupter 10 to the through-holes 4a. That is, the through-hole 4a of the substrate 4 are formed with an allowance of nearly 1.3 times the lead thickness, as stated before, being large in clearance. This is due to considerations of easiness in insertion of the lead into the through-hole and durability of a mold for the substrate (if adjusted to the lead thickness, a convex portion of the mold is thinned in thickness to lose durability). For this reason, the mere insertion of the lead into the through-hole tends to induce rotation due to chatter. The structure mentioned before can cause rotation in horizontal directions, even if the vertical float relative to the substrate is prevented. However, if the projections 31, 32 are provided with the provision of fitting holes to reduce chatter and clearance with respect to the projections for inserting into the fitting holes, the horizontal positioning in position can be positively carried out. The projections 31, 32 are provided in a diameter of approximately 0.7 mm and a height of 0.7 mm. The fitting holes are formed in a diameter of approximately 0.8–0.9 mm, being thicker than the thickness of the lead. The fitting holes on the substrate side are in a same degree as the through-hole, and accordingly there is no possibility of impairing the durability of the mold.

The projections 31, 32, even if provided only one in number at the bottom surface, can sufficiently suppress against horizontal inclination in relation to the other lead. However, if provided two or more, the rotation is completely prevented. In this case, it is preferred that the first projection 31 is provided at a corner on a diagonal line and the second projection 32 is on a side deviated from a corner, as shown in a bottom view in FIG. 1(c). Such asymmetrical arrangement (not in a point symmetry) with respect to a central point A1 in the bottom surface can eliminate the fear of soldering reverse in position, despite the leads 11, 12 and the leads 21, 22 are in the same form.

The photointerrupter 10, shown in FIG. 1(a) to FIG. 1(c), has the above-stated bend portions 11g, 21g provided in the leads 11, 21 for the light emitting element 1 and the light receiving element 2. Accordingly, when the photointerrupter 10 is attached to the substrate 4, the second bend point 11b is not inserted by interfering with the through-hole 4a. However, if a force is applied to push in, the lead 11 is inserted due to the springiness. When the photointerrupter 10 is inserted to a position that the bottom surface A is placed in abutment against the substrate 4, the second bend point 11b passes through the through-hole 4a to go out to a backside of the substrate and the lead 11 returns in a direction along its central axis. At this time, since the outer end of the second bend point 11b is at the position that the distance d from the central axis is greater than the radius r of the trough-hole 4a as stated before, it goes to a reverse side of the through-hole 4a at a backside of the substrate 4. Consequently, the photointerrupter 10 attached to the substrate 4 clamps the substrate 4 by a bottom surface A of the package 3 and the second bend point 11b of the bend portion 11g, 21g of the lead 11, 21. As a result, the photointerrupter 10 becomes immovable in respective upper and lower directions of the substrate 4, thus being firmly fixed.

Figure 2:
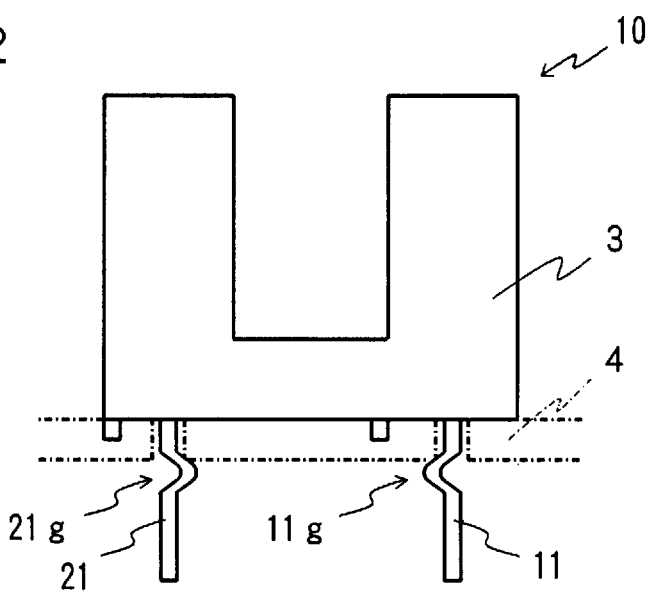
FIG. 2 is an explanatory view showing another form example of a bend portion of the lead of the photointerrupter of the present invention.

FIG. 2 shows another example in form of bend portions 11g, 21g of the leads 11, 21. In this example, the bending direction of the lead 11 at the first bend point 11a is reverse to FIG. 1, i.e. the bending is made in a direction to which the light emitting element 1 and the light receiving element 2 face. The bend portions 11g, 21g each have a bend point at a same position, as to both in axial position and radial position vertical to the axis, as that of the example shown in FIG. 1, wherein the function is also the same. The bending direction of the leads 11, 21 is not limited to these examples, but the bending may be made in other directions such as toward this or backside of the paper surface. Alternatively, the bending may be in directions different from the direction of between the light transmitting element 1 and the light receiving element 2. Also, the light emitting element 1 and the light receiving element 2 each have two leads respectively bent in directions different from each other. Further, the bending form is not limited to the sharp-edged convex shape as illustrated, but may be in other form such as a semicircular form.

Figure 3:
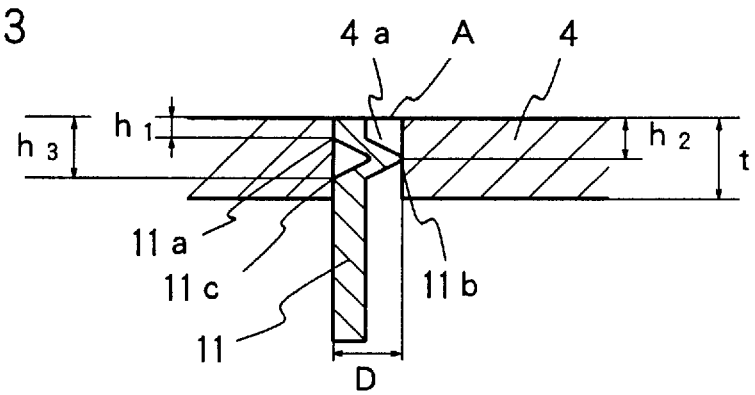
FIG. 3 is an explanatory view showing another form example of a bend portion of the lead of the photointerrupter of the present invention.

The example shown in FIG. 3 has a lead 11 bent in the same form as in FIG. 1. In this example, the first and second bend points 11a, 11b are formed at a position that the distance ($h_1$, $h_2$) from the bottom surface A of the package 3 is smaller than the thickness t of the substrate 4. They are formed such that the second bend point 11b exists within the through-hole in a state that the bottom surface A of the package 3 is in contact with the surface of the printed substrate 4. In the example shown in FIG. 3, the third bend point 11c is also formed to have a distance $h_3$ from the bottom surface A smaller than the thickness t of the printed substrate 4 such that it exists within the through-hole 4a. The dimension D, that is from an outer surface of the first bend point 11a to an outer surface of the second bend point 11b, is provided somewhat greater than the inner diameter 2 r of the through-hole 4a. Due to this, the lead 11, when pressed into the through-hole, is firmly fixed in the through-hole. With this structure, the vertical movement of the lead can also be suppressed in a manner similar to the structure shown in FIG. 1. Incidentally, the bending direction of the second bend point 11b may be in either direction, similarly to the example shown in FIG. 2. In brief, the bending may be made such that the distance D between the outer surface of the second bend point 11b and the outer surface of the first bend point 11a is somewhat greater than the inner diameter of the through-hole 4a.

Figure 4:
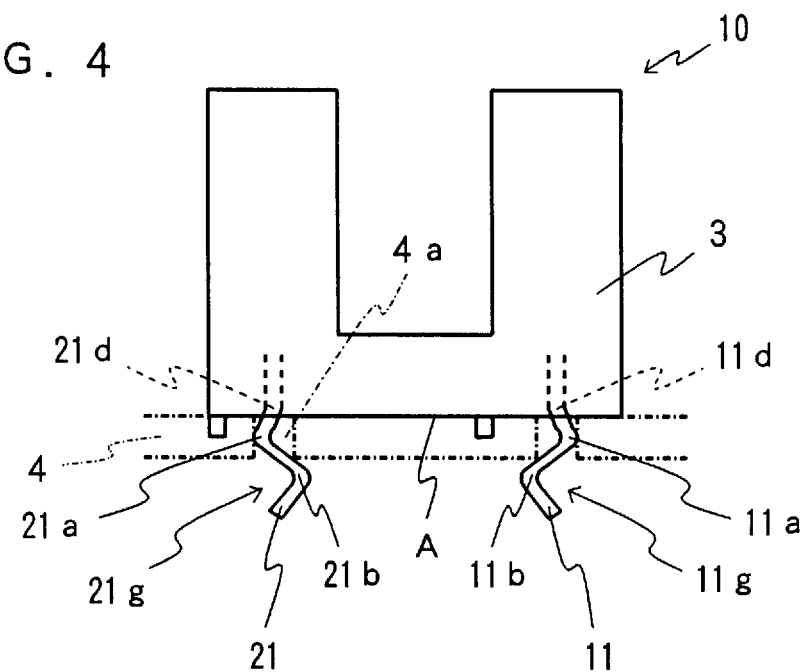
FIG. 4 is an explanatory view showing a further form example of a bend portion of the lead of the photointerrupter of the present invention.
Figure 5:
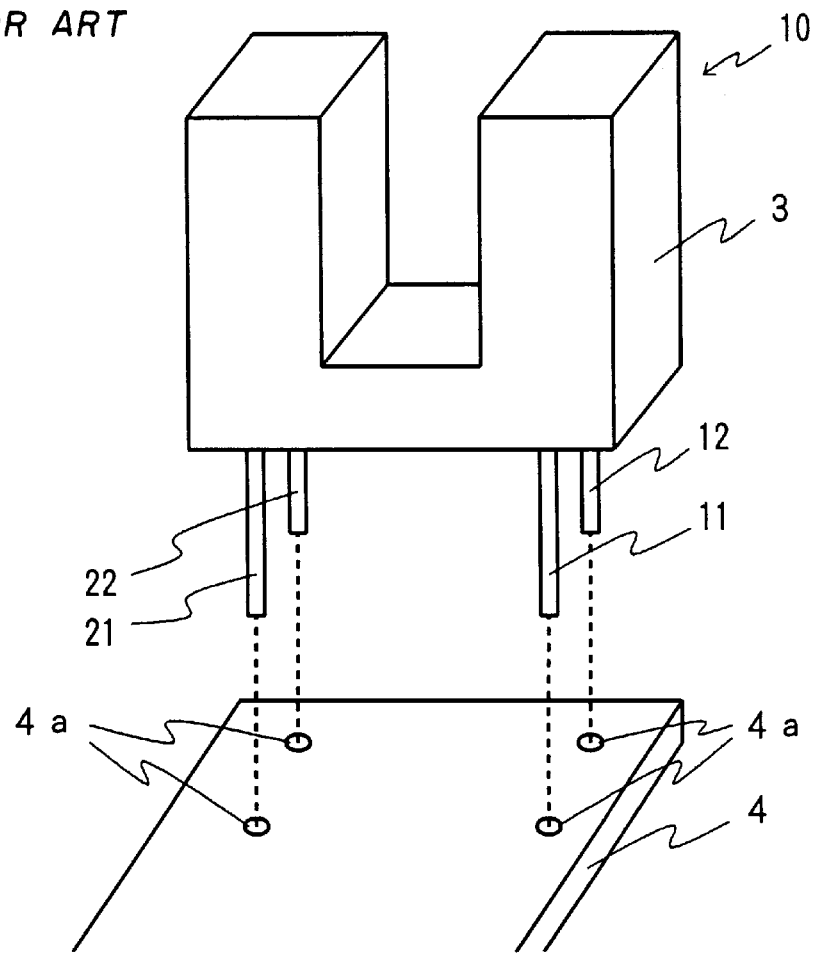
FIGS. 5(a) to 5(b) are explanatory views to mount a conventional photointerrupter onto a substrate.
Figure 5:
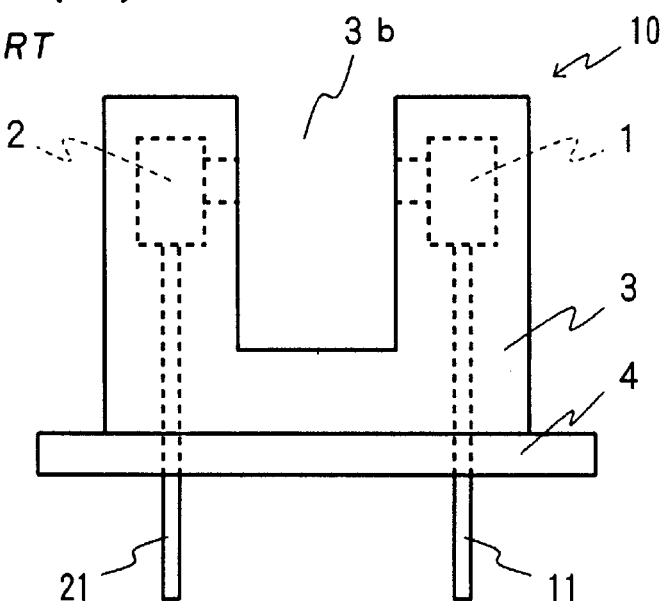

An example shown in FIG. 4 has respective bend portions 11g, 21g formed in a zigzag form in the leads 11, 21 for the light emitting element and the light receiving element. There are fourth bend points 11d, 21d in the package 3. The leads extend obliquely from the bottom surface A of the package 3 instead of in the central axis direction. The first bend points 11a, 21a are provided at such a position that the outer peripheral portion contacts with an inner wall of the through-hole 4a when the leads 11, 21 are inserted into through-holes 4a. The second bend points 11b, 21b are provided outward of the inner wall of the through-hole 4a. That is, the first bend points 11a, 12a are provided at a position equal to or somewhat greater than the radius of the through-hole from the central axis of the lead. The second bend points 11b, 21b are provided with greater radial dimensions than that. In this case, the distance between the outer end of the second bend point 11b, 21b and the central axis of the lead is preferably given approximately 2.5 times the radius of the through-hole 4a or the smaller.

The relationship in height direction of the first and second bend points 11a, 21a, 11b, 21b from the bottom surface A of the package 3 is the same as the example shown in FIG. 1. In this example, the bend portion from the first bend point 11a, 21a toward the light emitting or light receiving portion has only the fourth bend portion 11d, 21d. However, there is no problem if the bend point is provided greater in number. The fourth bend point 11d, 21d may be exposed on an lower side from the bottom surface A of the package 3, provided that the first and second bend points 11a, 21a, 11b, 21b are in the relationship as stated before. Such structure is no problem. Also, a further bend point may be provided on a tip side of the lead 11, 21 with respect to the second bend point 11b, 21b.

When the photointerrupter 10 structured in FIG. 4 is attached to the substrate 4, since the second bend point 11b, 21b in radial position is outward of the diameter of the through-hole 4a, it is stopped without being inserted into the through-hole 4a. However, the pressing in, similarly to the FIG. 1 structure, causes passing through the through-hole 4a due to the elasticity of the lead 11, 21. The substrate 4 is clamped by the bottom surface A of the package 3 and the second bend point 11b, 21b, thus obtaining fixing. According to this structure, the first bend point 11a, 21a also in contact with the inner wall of the through-hole 4a, thereby providing fixing further firmly.

With the zigzag form shown in FIG. 4, if the second bend point 11b, 21b is formed at a position from the bottom surface of the package 3 smaller than the thickness of the substrate 4 such that it also exists within the through-hole 4a and the distance from the central axis of the lead 11, 21 to the outer surface of the second bend point is almost equal to the distance from the central axis to the outer surface of the first bend point 11a, 21a, two convex portions are contacted with the inner wall of the through-hole to provide fixing due to the spring of the lead. Thus similar effect is obtained.

The lead bend portions for the light emitting element and the light receiving portion can be always constantly formed by separately press-forming with using dies after forming the light emitting element and the light receiving element. That is, pellets of a light emitting element and a light receiving element are mounted on a leadframe. The light emitting portion or the light receiving portion and wire-bonded and then molded by a transparent resin. Then leads are cut and thereafter formed by die. The light emitting element and the light receiving element thus formed are inserted within a case and fixed, or placed in a metal die and molded by an opaque resin. Thus, a photointerrupter is obtained that has a light emitting element and a light receiving element fixed by a package.

According to the present invention, the photointerrupter, requiring exact accuracy in position and direction of attachment to a substrate, can be firmly fixed by the bend portion formed in the lead and a bottom surface of a package thereof. Accordingly, there is no possibility of movement due to vibration or the like during soldering, providing fixation with very accurate positional relationship. Further, it is satisfactory to insert into and press in the lead into the through-hole of the substrate. Accordingly, there is no necessity of bending an end portion of the lead after insertion. Thus, a reliable photointerrupter assembly is obtainable by a very simple assembling process and with high yield. Incidentally, in the case of molding, the lead within the package may be completely fixed by a molding resin to the bottom surface of the package. However, it is further preferred to provide a certain length in a free state, because the lead springiness can be fully utilized when inserting the second bend portion into the through-hole.

INDUSTRIAL APPLICABILITY

A photointerrupter of the present invention is built, together with other electric circuits, on a printed substrate or the like, and is usable as a sensor such as for a VTR reel sensor and positional detection of a printer printhead.

What is claimed is:

1. A photointerrupter, comprising:
    a light emitting element having a lead;
    a light receiving element having a lead;
    a package for oppositely fixing said light emitting element and said light receiving element through a space so that light transmission and reception can be made therebetween, and having a bottom surface from which the leads outwardly extend; and
    a movement preventing bend portion having at least a first bend point formed in said leads extending from the bottom surface of said package at a dimensional position smaller than a thickness of the substrate to which the lead from the bottom surface is inserted into and fixed to a through-hole.

2. A photointerrupter according to claim 1, wherein said bend portion further has a second bend point at a dimensional position greater than the thickness of said substrate from the bottom surface of the package.

3. A photointerrupter according to claim 1, wherein said bend portion has further a second bend point at a dimensional position smaller than the thickness of said substrate from the bottom surface of said package, and said first and second bend points each being formed contactable with said inner wall of said through-hole.

4. A photointerrupter according to claim 1, wherein a projection that can be fitted to a fitting hole formed in said substrate is provided on the bottom surface of said package.

5. A photointerrupter according to claim 2, wherein said first bend point is provided in the vicinity of a central axis of said leads extending from said light emitting element and said light receiving element, and said second bend point being provided at a position greater than a radius of said through-hole of said substrate from the central axis.

6. A photointerrupter according to claim 2, wherein said first bend point is provided at a position that contacts with an inner wall of said through-hole when said lead is inserted into said through-hole, and said second bend point being provided at a position that is outward of the inner wall of said through-hole when said lead is inserted into said through-hole.

7. A photointerrupter according to claim 3, wherein said bend portion has further a third bend point at a dimensional position smaller than the thickness of said substrate from the bottom surface of said package, and said third bend point being formed contactable with said inner wall of said through-hole.

8. A photointerrupter according to claim 4, wherein said projection is provided two or more at asymmetric locations with respect to a center point on the bottom surface of said package.

* * * * *